United States Patent
Wong et al.

(10) Patent No.: US 7,899,649 B1
(45) Date of Patent: Mar. 1, 2011

(54) SIGNAL DETECT FOR HIGH-SPEED SERIAL INTERFACE

(75) Inventors: Wilson Wong, San Francisco, CA (US); Allen Chan, San Jose, CA (US); Sergey Shumarayev, Los Altos Hills, CA (US); Thungoc M. Tran, San Jose, CA (US); Tim Tri Hoang, San Jose, CA (US); Weiqi Ding, Fremont, CA (US)

(73) Assignee: Altera Corporation, San Jose, CA (US)

( * ) Notice: Subject to any disclaimer, the term of this patent is extended or adjusted under 35 U.S.C. 154(b) by 474 days.

(21) Appl. No.: 12/053,884

(22) Filed: Mar. 24, 2008

(51) Int. Cl.
*G06F 19/00* (2006.01)

(52) U.S. Cl. ...................................... 702/189

(58) Field of Classification Search .............. 702/76, 702/77, 117, 118, 182–185, 189
See application file for complete search history.

(56) References Cited

U.S. PATENT DOCUMENTS

2004/0203559 A1* 10/2004 Stojanovic et al. .......... 455/403

* cited by examiner

*Primary Examiner*—Edward Raymond
(74) *Attorney, Agent, or Firm*—Ropes & Gray LLP; Jeffrey H. Ingerman

(57) ABSTRACT

Signal detection circuitry for a serial interface oversamples the input—i.e., samples the input multiple times per clock cycle—so that the likelihood of missing a signal is reduced. Sampling may be done with a regenerative latch which has a large bandwidth and can latch a signal at high speed. The amplitude threshold for detection may be programmable, particularly in a programmable device. Thus, between the use of a regenerative latch which is likely to catch any signal that might be present, and the use of oversampling to avoid the problem of sampling at the wrong time, the likelihood of failing to detect a signal is greatly diminished. Logic, such as a state machine, may be used to determine whether the samples captured s do or do not represent a signal. That logic may be programmable, allowing a user to set various parameters for signal detection.

23 Claims, 7 Drawing Sheets

SIGNAL DETECT FOR HIGH-SPEED SERIAL INTERFACE

BACKGROUND OF THE INVENTION

This invention relates to signal detect circuitry for a high-speed serial interface, particularly in a programmable device.

Many integrated circuit devices can be programmed. Examples of programmable integrated circuit devices include volatile and non-volatile memory devices, field programmable gate arrays ("FPGAs"), programmable logic devices ("PLDs") and complex programmable logic devices ("CPLDs"). Other examples of programmable integrated circuit devices include application-specific integrated circuits (ASICs), processors and microcontrollers that are programmable via internal or external memory. Programmable integrated circuit devices, such as programmable logic devices (PLDs) in particular, frequently incorporate high-speed serial interfaces to accommodate high-speed (i.e., greater than 1 Gbps) serial I/O standards. Typically, a PLD may have multiple high-speed serial interface channels.

PLDs frequently incorporate high-speed serial interfaces to accommodate high-speed (i.e., greater than 1 Gbps) serial I/O standards—e.g., the XAUI (10 Gbps Extended Attachment Unit Interface) standard. In accordance with the XAUI standard, a high-speed serial interface includes transceiver groups known as "quads," each of which includes four transceivers and some central logic.

Each transceiver typically includes signal detection circuitry in both its receiver and transceiver portions. In the receiver portion, the signal detection circuitry typically is referred to as "signal detect" or "SD," and generates a signal that alerts the rest of the receiver to incoming data. In the transmitter portion, the signal detection circuitry typically is referred to as "receiver detect" or "RxD," and generates a signal when it detects that transmitted signals are being received by a receiver at the other end. The same is true in serial transceivers other than those used with the XAUI standard.

Signal detection at high speeds is difficult. This is recognized in the field, to the point that the PCI-Express Generation 2 (PCIe2) high-speed serial standard specifies a data pattern to allow easier detection of the presence of a signal.

Many known signal detection circuits are analog, and typically incorporate a rectifier and an integrator, which produce a signal that is then compared to a reference level. However, the nature of rectification and integration is such that they cause a loss of accuracy. Specifically, this technique typically utilizes a high-speed peak detector in a voltage-follower configuration. The voltage follower is designed so that the charge current is much higher than the discharge current. This may lead to static offset. In addition, the required sense amplifier needs to have an extremely large bandwidth, making it very difficult to design. Moreover, mismatches and pattern dependencies can cause the actual detection level to vary dramatically from unit to unit.

Timing issues may also arise because many high-speed serial protocols are asynchronous. If input data are sampled in accordance with the system clock, and the sampling time happens to fall within a transition between data eyes, then even if data were present, it might not be detected.

SUMMARY OF THE INVENTION

The present invention provides more accurate signal detection circuitry in serial interfaces, particularly on a programmable logic device. In accordance with embodiments of the invention, the input is oversampled—i.e., is sampled multiple times per clock cycle or unit interval—so that the likelihood of missing a signal is reduced.

Moreover, in accordance with embodiments of the present invention, sampling is done with a regenerative latch which has a large bandwidth and can latch a signal at high speed. The amplitude threshold for detection may be programmable, particularly in a programmable device.

Thus, between the use of a regenerative latch which is likely to catch any signal that might be present, and the use of oversampling to avoid the problem of sampling at the wrong time, the likelihood of failing to detect a signal is greatly diminished. Logic, such as a state machine, may be used to determine whether the samples captured—some of which may indicate the presence of a signal while others fail to so indicate—do or do not represent a signal. That logic may be programmable, allowing a user to set various parameters for signal detection.

Thus, in accordance with the present invention, there is provided a signal detection method for use in a serial interface whose signal input has a data rate and a corresponding unit interval. The method includes sampling the signal input a plurality of times during each unit interval to provide a plurality of samples, and filtering that plurality of samples to determine the presence of a signal on the signal input.

Signal detect circuitry in accordance with the present invention, for use in a high-speed serial interface, includes a signal input having a data rate with a unit interval, a first plurality of sampling circuits receiving that signal input, and a source of a second plurality of clock signals, each respective clock signal having that data rate and each clocking a respective one of the sampling circuits. The plurality of clock signals are offset in phase from one another, and the signal input is sampled a plurality of times per unit interval according to the phase offset.

A programmable logic device incorporating such an interface also is provided.

BRIEF DESCRIPTION OF THE DRAWINGS

Further features of the invention, its nature and various advantages, will be apparent upon consideration of the following detailed description, taken in conjunction with the accompanying drawings, in which like reference characters refer to like parts throughout, and in which.

DETAILED DESCRIPTION

Peak detection is used in many applications, such as envelope detection, to extract the absolute value of a signal or for signal amplitude detection from a differential source. In differential signalling standards such as PCI Express, a circuit preferably is capable of detecting differential input amplitudes as small as 165 mV to indicate a valid level. However, known designs have pattern dependencies. For example, a pattern with a high transition density would have a different detection threshold as compared to a pattern with a lower transition density.

In signal detection schemes, it is necessary to set an amplitude threshold at which a signal is considered valid and an amplitude threshold at which a signal is considered not valid. For example, if Vid=200 mV is set as the threshold at which a signal is considered valid, then if the amplitude equals or exceeds 200 mV, a signal SD (signal detect) would be asserted. At the same time, Vid=150 mV may be set as the threshold below which the signal is considered invalid, so that for such a signal SD=0. Signal detection that requires distinguishing between those levels is difficult at gigabit data rates, which is why, as described above, the PCIe2 standard specifies a data pattern for use in detecting of the presence of a signal.

Figure 1:
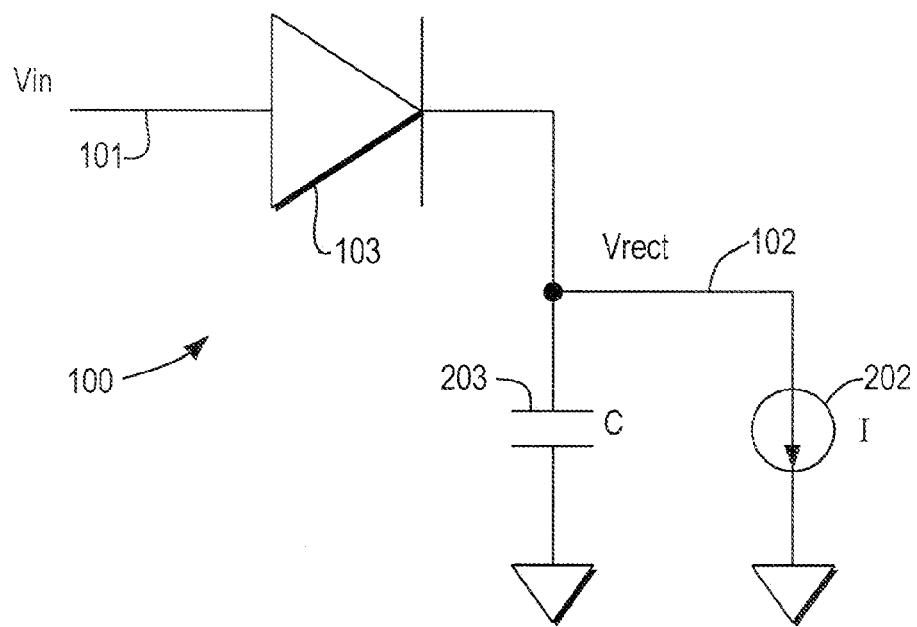
FIG. 1 is a schematic representation of a known signal amplitude detector or peak detector.

FIG. 1 shows a simple known signal amplitude detector or peak detector 100 which can be used for signal detection. However, diode 103 will cause a voltage drop from input 101 to output 102 of about 0.7V, which may be undesirable. Therefore, circuit 200 of FIG. 2 may be used instead. In circuit 200, an operational amplifier 201 is used instead of diode 103. Op-amp 201 is configured in a unity gain configuration, so that the value of output 102 follows input 101, reducing or eliminating the aforementioned voltage drop at output 102. Circuit 300 of FIG. 3 which is a differential version of circuit 200, in which the output 102 is like an "OR" function in that the higher of the two inputs 101, 301 is used for the rectified value.

Figure 2:
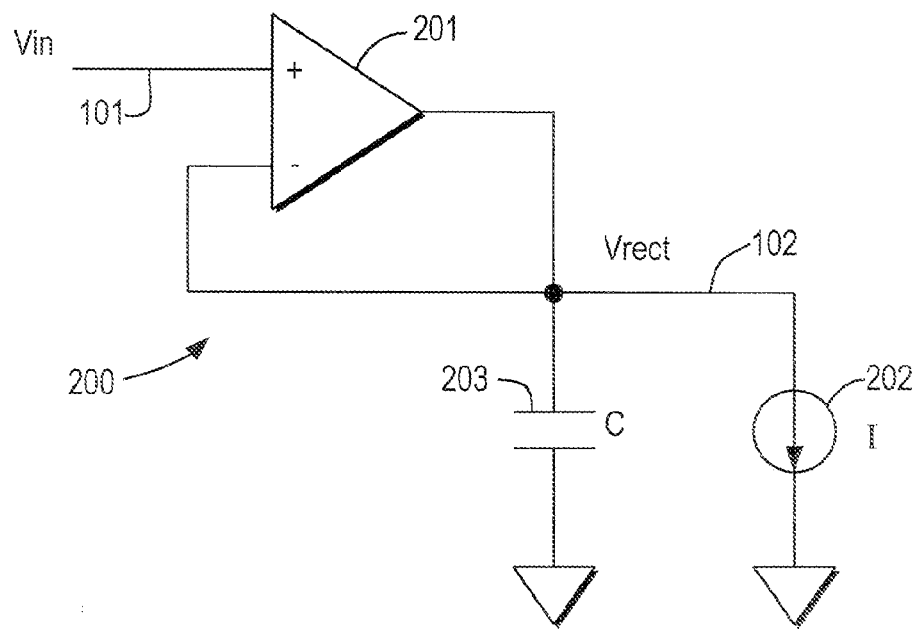
FIG. 2 is a schematic representation of an alternate embodiment of a known signal amplitude detector or peak detector.
Figure 3:
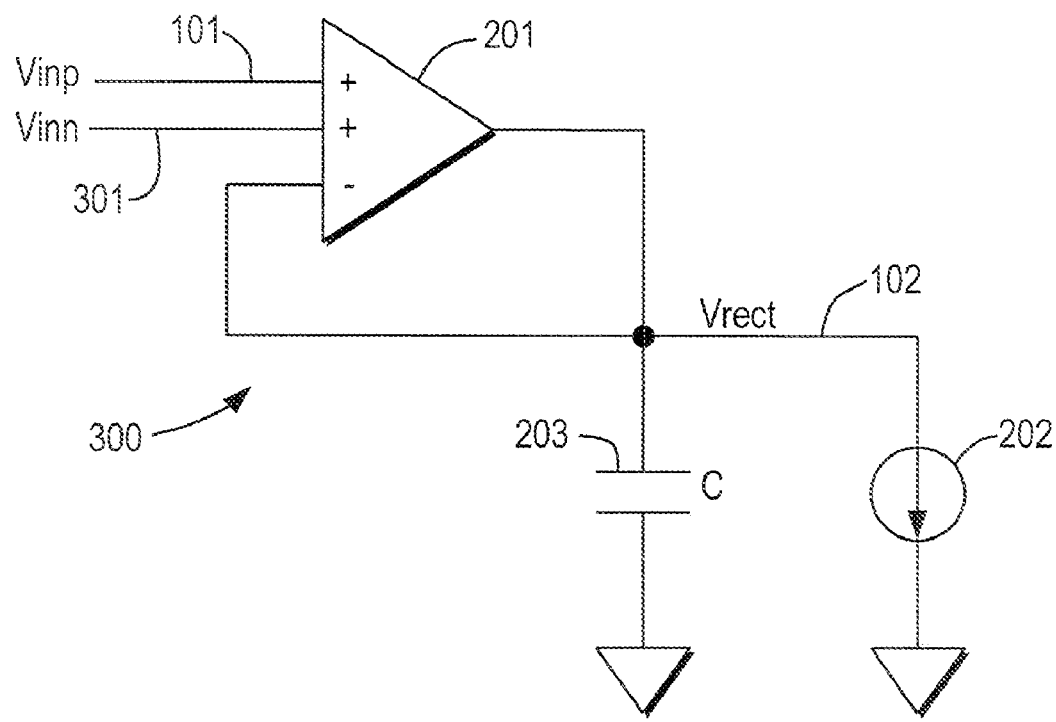
FIG. 3 is a schematic representation of a differential embodiment of the detector of FIG. 2.

Peak detection is accomplished by proper design of the charge/discharge currents. Ideally, the charging current should be much greater than the discharging current. In FIGS. 2 and 3, the discharge current 202 is shown as being external to op-amp 201, but in a real-world implementation, both the charge and discharge currents usually would be part of op-amp 201. Thus, it is preferred that op-amp 201 be designed so that the charging current is much larger than the discharge current. An integration capacitor 203 is used to extract the energy used for comparison. The fact that the charging current is much larger than the discharging current causes the output to be rectified. For example, if the charging current were infinitely large and the discharge current were vanishingly small, the output would quickly follow any increasing value of input, while any value of input lower than the previous value would not cause the output to reduce in value.

Several constraints contribute to determining the value of the discharge current. First, a discharge current allows the circuit to detect whether the signal of interest is reducing in amplitude. Otherwise the circuit would only catch the maximum value and never detect that the amplitude has decreased. For example, in FIG. 5, discussed in more detail below, the input signal amplitude has decreased and the rectified output must change to reflect the decreased input. Second, there is usually a specified amount of time to detect when a signal has decreased below a predetermined amplitude, whereupon signal SD should be de-asserted. Third, in practical op-amp designs, a large mismatch in charge and discharge currents leads to large offsets. Integration capacitor 203 averages out the rectified value to reduce instantaneous transient effects, which might lead to false results.

The size of integration capacitor 203 and time required to detect the decreased signal amplitude would govern the discharge current based on the relationship I=C(dv/dt), where dv is the voltage difference between the largest signal amplitude and the signal detect (SD) threshold reference level. Integration capacitor 203 is usually large in area.

Figure 4:
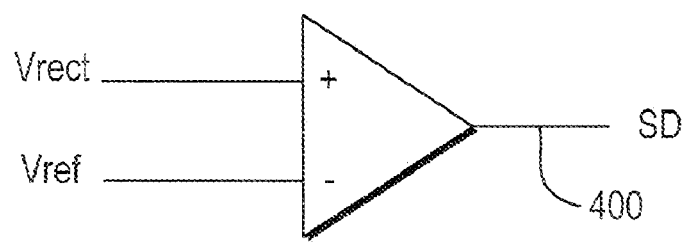
FIG. 4 is a schematic representation of the comparison of a signal amplitude with a threshold.
Figure 5:
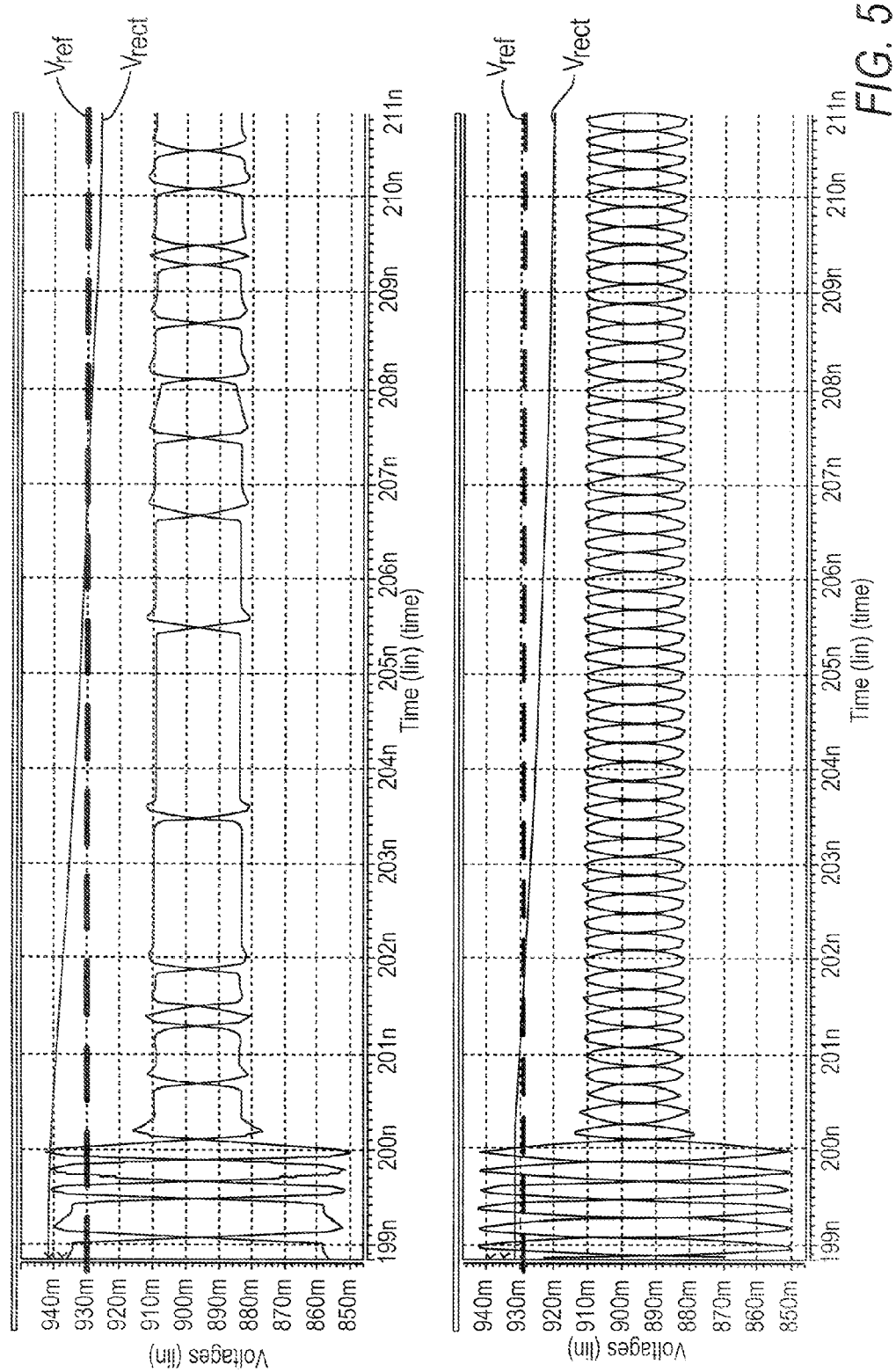
FIG. 5 is an example of rectified output and reference levels for different input amplitudes.

The output Vout is usually compared with a known or fixed reference value to determine if the signal amplitude has reached a certain threshold. This is shown in FIG. 4, where the rectified output Vrect is compared with a reference level Vref to generate the SD signal 400. For simplicity, one can assume that there is no hysteresis, meaning that as soon as the input amplitude is such that Vrect>Vref, then SD=1, and similarly as soon as Vrect<Vref then SD=0. FIG. 5 shows an example of Vrect and Vref levels for different input amplitudes.

Figure 6:
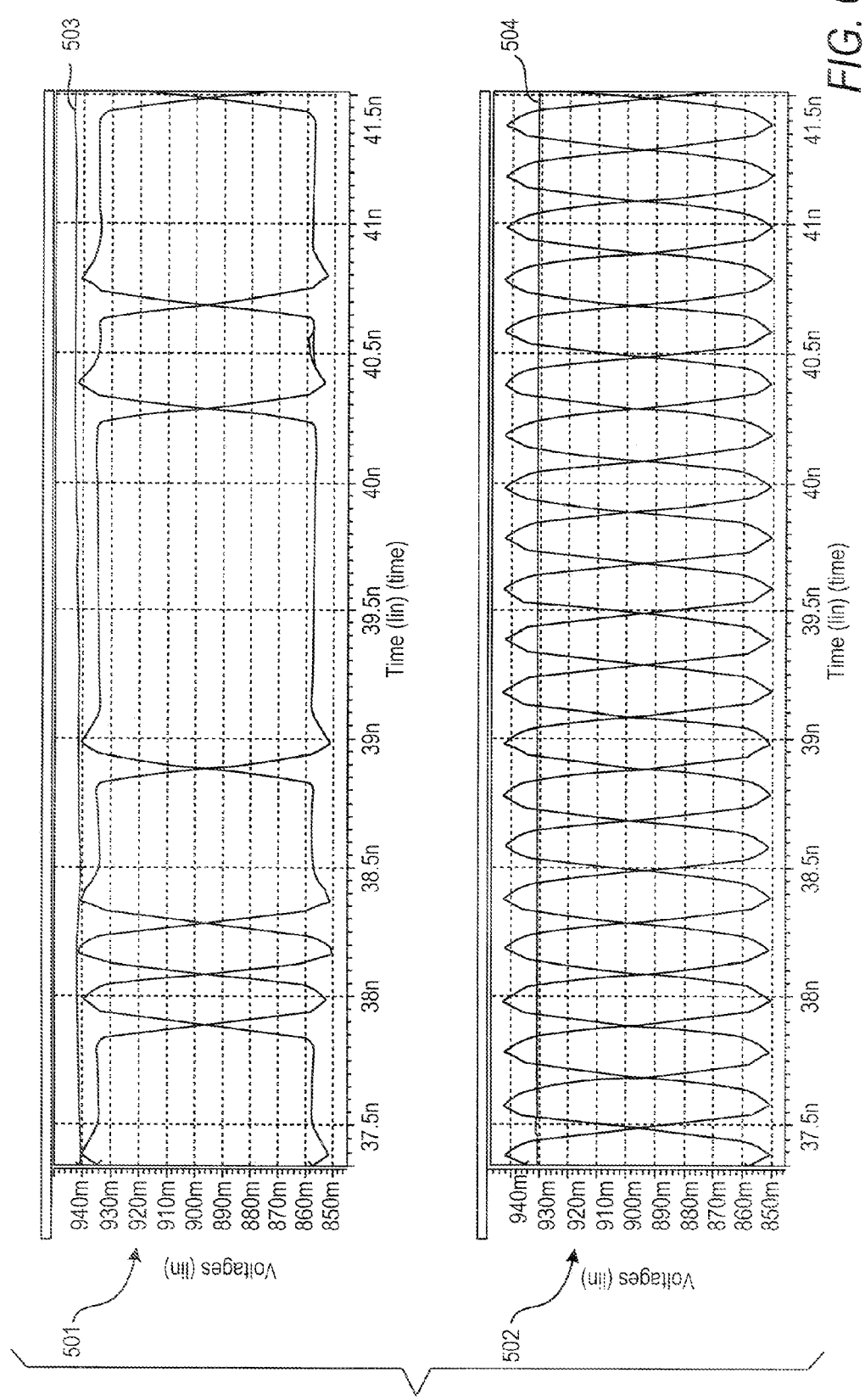
FIG. 6 is a graphical comparison of a pseudorandom waveform to a repeating waveform.

Pattern dependency is another factor to take into account. FIG. 6 shows two differential input waveforms 501, 502. Input waveform 501 is a pseudorandom input and input waveform 502 is a repeating 101010 pattern. Also shown in FIG. 6 is the respective rectified output Vrect 503, 504 for each waveform, which is generated from the inputs 501, 502. As we can see, the rectified level, Vrect 503, 504, is dependent on the pattern. For waveform 501 the rectified level is about 941 mV, while for the repeating pattern of waveform 502 the rectified level is about 931 mV for the same peak values. This is undesirable, especially in high-speed differential standards where it is important to be able to accurately detect very small voltage amplitudes to determine whether a signal is valid or invalid.

Figure 7:
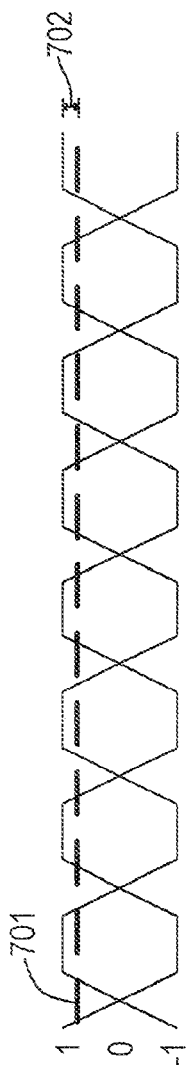
FIG. 7 is a graphical representation of rectification of a differential signal.

The Vrect difference arises because of the averaging effect of a discharge current which cannot be vanishingly small. FIG. 7 shows the rectification of a differential signal, where Vrect 701 approaches "1". However, because there is a finite amount of discharge current, the contribution from the intervals where the signal amplitude decreases between data eyes causes an offset 702 in the value of Vrect as integrated by capacitor 203. As a result, if the sampling window or aperture is too long, the sampled value may be too low, and a signal that otherwise should have been detected will not be detected.

In accordance with an embodiment of the present invention, which can be used with newer standards that require accurate detection of single-ended input signals at 75 mV or differential signals at 150 mV peak-to-peak, a regenerative latch comparator is used to sample the incoming signal for signal detection. A regenerative latch comparator has good resolution for a small aperture time. In a regenerative latch the relationship of the aperture time to the input voltage is exponential For example, an input difference of 1 mV can be resolved in about 220 ps under worst-case conditions. This means one can trade off resolution against aperture time.

One difficulty that arises with short aperture times is determining exactly where to sample the data. The function being described here is signal detect—determination of whether or not there is an incoming signal present. Any determination of what that signal actually is or when its data eyes occur are not made until later. Therefore, there is no way to know exactly when to sample. However, not sampling in the middle of the data eye can cause errors. For example, taking the extreme case of a repeated 101010 pattern, if sampling is performed once per unit interval and, by chance, happens to occur at the transition, the signal might never be detected.

Therefore, in accordance with the invention, incoming signals are oversampled—i.e., are sampled multiple times per unit interval of the system clock. This relieves the necessity for sampling exactly at precisely the right time, which would be very difficult at gigabit speeds. The precise number of samples per unit interval may be programmable, particularly in a programmable device, and also may be a function of available clocks. For example, in some PLDs available from Altera Corporation, of San Jose, Calif., quadrature clocks—i.e., four phases of the device clock separated by 90° of phase—are available on the device, and therefore the signal easily could be sampled four times per unit interval.

However, the characteristics of the regenerative latch used for sampling, combined with the nature of the input signal, may affect the choice of sampling rate. As stated above, the aperture size is related to the input voltage. Therefore, the aperture size may be too long to allow four samples per unit interval. In such a case, for example, only two samples may be taken per unit interval. This would not seriously affect the result; because this is only signal detection, even missing one bit would not be detrimental. Moreover, this would still be an improvement over signal detection using envelope detection, which takes much longer.

Figure 8:
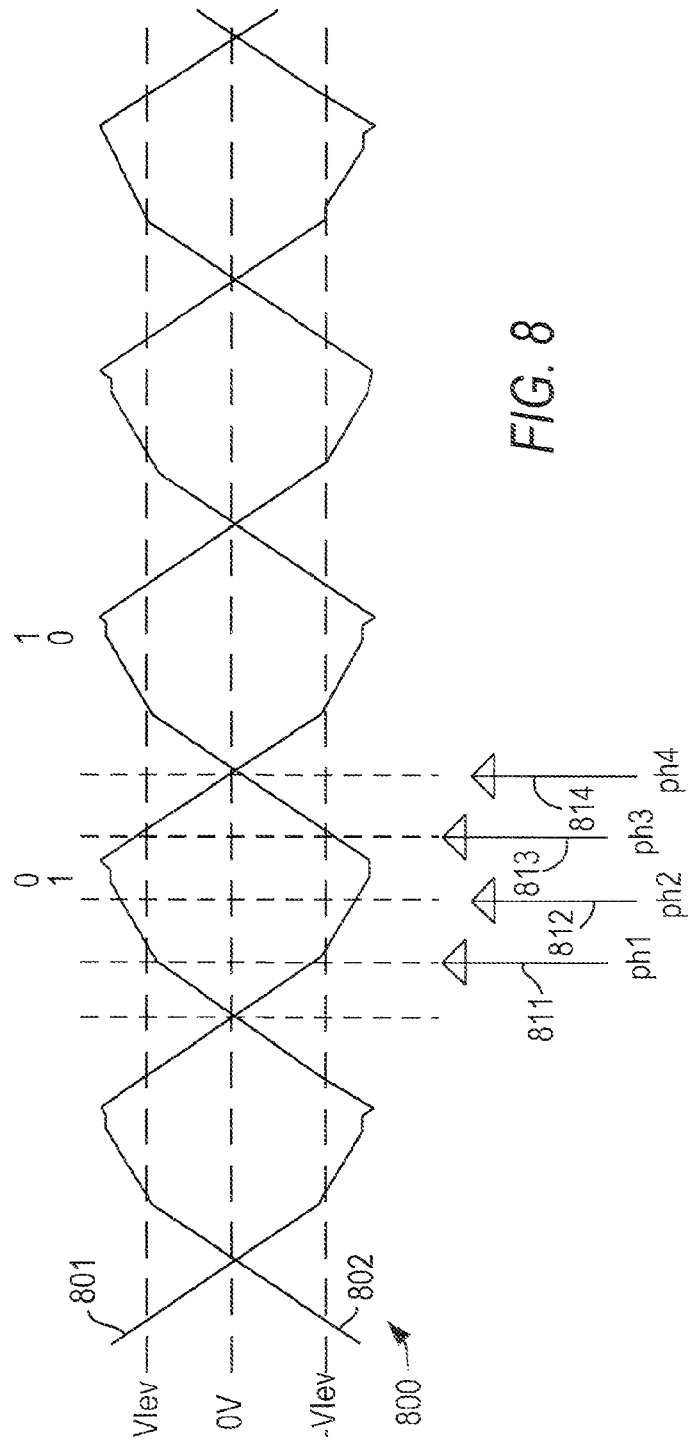
FIG. 8 is a graphical representation of the sampling of a differential signal in accordance with an embodiment of the invention.

An example of the sampling scheme is shown in FIG. 8, which shows a differential signal 800 having positive arm 801 and a negative arm 802. Vlev (and −Vlev) represent the level above (below) which a signal may be considered to be present. Generally, positive and negative arms 801, 802 would be expected to be symmetrical, and therefore one might look only at one of the arms (typically positive arm 801), which is also the case for a single-ended signal. However, there may be cases in which the arms are not symmetrical, or at least not guaranteed to be symmetrical, and in those cases one might look at both arms.

As seen in FIG. 8, signal 800 is sampled at four phases 811-814 of the system clock. The resulting data in this symmetrical example, where S represents positive arm 801 and compared to +Vlev, and nS represents negative arm 802 and is compared to −Vlev, are:

S[0:3] 0 1 1 0
nS[0:3] 1 0 0 1 reflecting two of the four samples being above Vlev (or below −Vlev). Note that the values for nS assume a convention of the higher value (i.e., less negative) being a "1" and the lower value (i.e., more negative) being a "0". Alternatively, if one uses an absolute value convention—meaning that for both S and nS, the value is a "0" if the absolute value is between 0 and Vlev, and the value is "1" if the absolute value exceeds Vlev—then in this symmetrical example the values for S and nS would be the same.

Alternatively, all samples on both arms 801, 802 could be compared to +Vlev, in which case the resulting data for arm 801 representing a "1" would be:

S[0:3] 0 1 1 0
nS[0:3] 0 0 0 0

In that case, the negative arm data nS would only be a check, in that if there were any 1's in negative arm data nS where arm 801 is supposed to represent a "1", it would indicate a problem. According to this alternative, if arm 801 is supposed to represent a "0" and arm 802 is supposed to represent a "1", then the data would be:

S[0:3] 0 0 0 0
nS[0:3] 0 1 1 0 and the presence of a "1" in positive arm data S would indicate a problem.

It can be seen in this example that the sample on fourth phase 814 falls squarely between data eyes, and yet, because of the four-fold oversampling, the signal still is detected on at least two of the other phases 812, 813.

The values of S and nS could be subject to varying amounts of filtering. Thus, at one extreme, any detection of a "1" in S (or a "1" in nS in the absolute value embodiment) could be considered signal detection. This might particularly be the case when only one arm 801, 802 is being examined (or in a single-ended case). At the other extreme, some minimum number of consecutive unit intervals in which at least one "1" is (or perhaps some larger number of 1's are) detected might be required. In between, any other combination of criteria might be used. For example, where both arms 801, 802 are examined, it might be considered sufficient to have at least one bit (or some other number of bits) that indicates a signal in either arm 801, 802 to assert signal detect, or, particularly where the two arms 801, 802 are not always expected to be symmetrical, it may be required to have sufficient bits (whether one bit or some other number of bits) in both arms 801, 802 before signal detect will be asserted. The criteria can be programmed into any suitable decision or filtering circuitry or processor, such as a state machine, which will make the determination to assert (or de-assert) signal detect.

Figure 9:
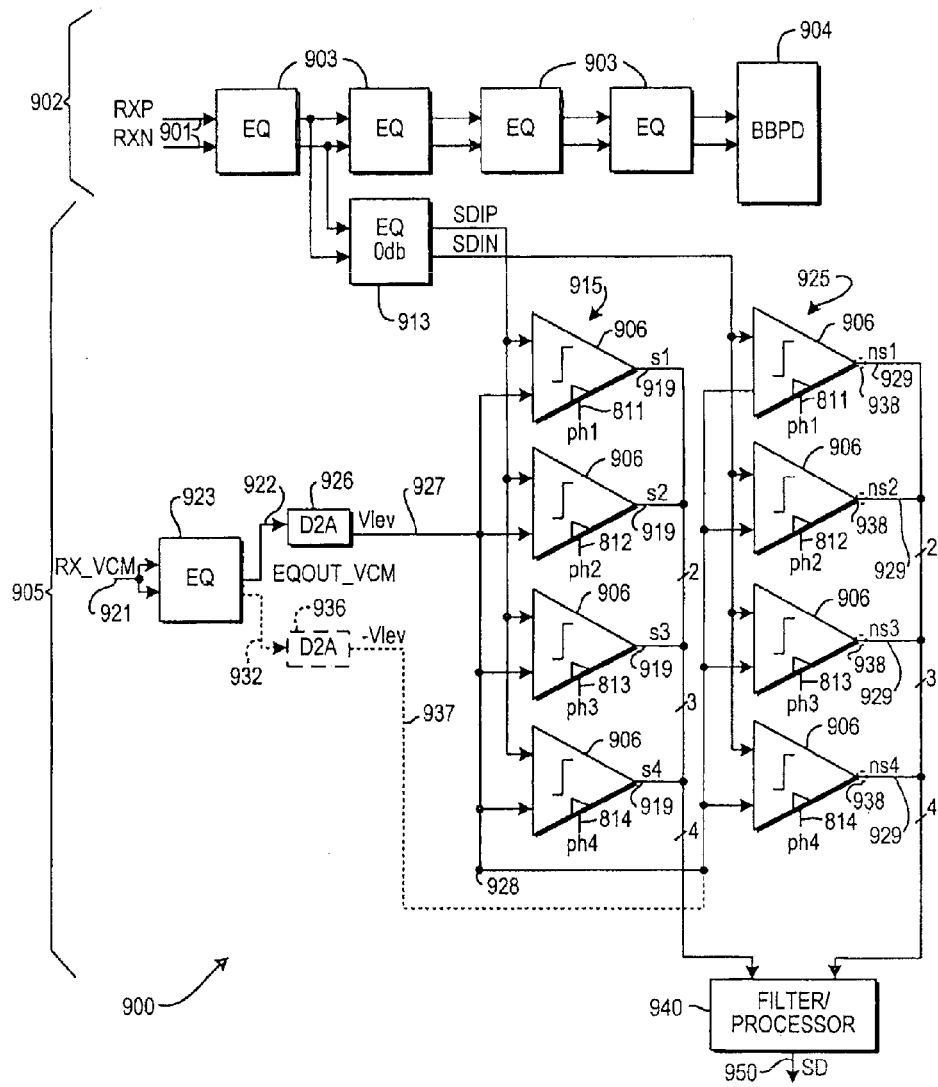
FIG. 9 is a schematic representation of an embodiment of a sampling architecture in accordance with the invention.

At a data rate of 2.5 Gbps at half-rate operation, one unit interval is 800 ps. Thus, in the example of FIG. 8, each phase is sampled every 800 ps. An example of a sampling architecture 900 for performing the sampling is shown in FIG. 9. In architecture 900, received differential data 901 is input to receive channel 902, which includes four equalizer stages 903, Bang-Bang phase detector 904 and additional circuitry (not shown). The signal detect circuitry 905 taps its signal detect input signal from channel 902. As shown, a 0 dB equalizer stage 913 is added to prevent loading on channel 902, but if loading is acceptable, the signal detect input signal could be tapped directly without adding equalizer 913.

Signal detect circuitry 905 may include two groups 915, 925 of comparators 906. Preferably, each comparator 906 is a high-speed, differential regenerative latch, clocked by a respective one of phases 811-814. Additional equalizer 923 may be added to derive from the common-mode voltage (VCM) 921 of the received signal 901 an equalized VCM signal 922, which then is preferably converted back to analog form by digital-to-analog converter 926 to provide Vlev signal 927 that may be used as a reference by all comparators 906. This embodiment may be used when only one arm, and particularly positive arm 801, or a single-ended signal, is being examined.

Alternatively, a second, negative, equalized VCM signal 932 may be derived, which then is preferably converted back to analog form by digital-to-analog converter 936 to provide −Vlev signal 937 that may be used as a reference by comparators 906 in group 925. In this case, the connection of +Vlev signal 927 to the reference inputs in group 925 is severed at 928, and signal 937, shown in phantom, is connected to those inputs. If the outputs 929 of comparators 906 in group 925 are inverted at 938 (shown in phantom), then the negative arm data nS would mirror the positive arm data S for symmetrical signals (the absolute value embodiment described above). Comparator outputs 919, 929 may be input to decision or filtering circuitry or processor 940, which may be a state machine, which makes the determination to assert (or de-assert) signal detect signal 950.

A PLD 10 incorporating a quadrature clock source 11 and a serial interface using signal detect according to the present invention may be used in many kinds of electronic devices.

Figure 10:
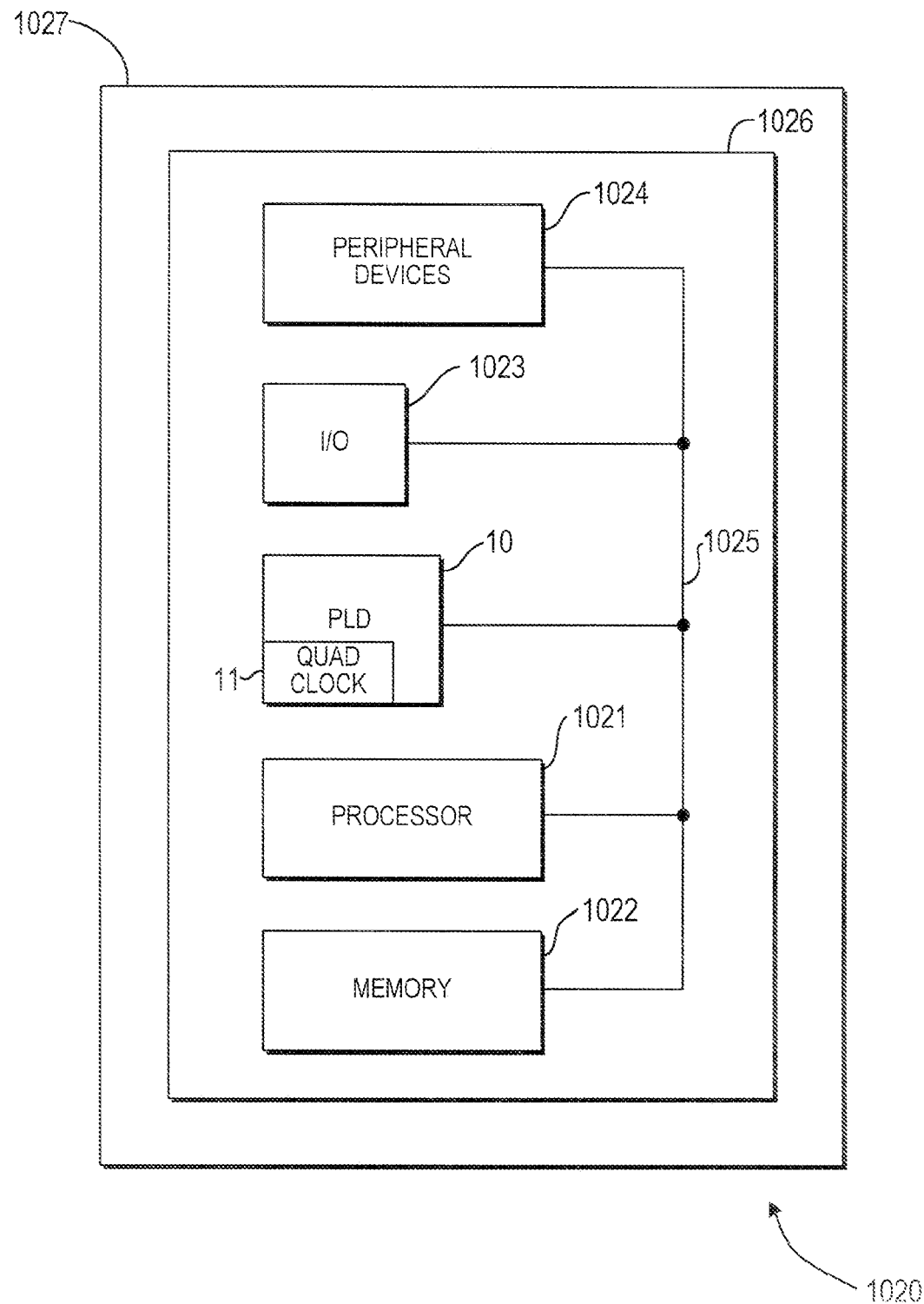
FIG. 10 is a simplified block diagram of an illustrative system employing a programmable logic device incorporating a serial interface in accordance with the present invention.

One possible use is in a data processing system 1000 shown in FIG. 10. Data processing system 1000 may include one or more of the following components: a processor 1001; memory 1002; I/O circuitry 100 and peripheral devices 100 These components are coupled together by a system bus 1000 and are populated on a circuit board 1006 which is contained in an end-user system 1007.

System 1000 can be used in a wide variety of applications, such as computer networking, data networking, instrumentation, video processing, digital signal processing, or any other application where the advantage of using programmable or reprogrammable logic is desirable. PLD 10 can be used to perform a variety of different logic functions. For example, PLD 10 can be configured as a processor or controller that works in cooperation with processor 1001. PLD 10 may also be used as an arbiter for arbitrating access to a shared resources in system 1000. In yet another example, PLD 10 can be configured as an interface between processor 1001 and one of the other components in system 1000. It should be noted that system 1000 is only exemplary, and that the true scope and spirit of the invention should be indicated by the following claims.

Various technologies can be used to implement PLDs 10 as described above and incorporating this invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. Circuitry for use in a high-speed serial interface, said circuitry comprising:
    an input for receiving a signal, said signal having a data rate with a unit interval;
    a first number of sampling circuits receiving said signal from said input, said first number being at least two;
    a source of a second number of clock signals, said second number being at least two, each respective clock signal having said data rate and each respective clock signal clocking a respective one of said sampling circuits; wherein:
    said plurality of clock signals differ from one another in phase by a phase offset; and
    said signal on said input is sampled a plurality of times per unit interval according to said phase offset.

2. The circuitry of claim 1 wherein each of said sampling circuit circuits comprises a detector including at least one regenerative latch.

3. The circuitry of claim 2 wherein:
    each of said at least one regenerative latch comprises a reference input; and
    a common mode signal is derived from said signal on said input and used as said reference input.

4. The circuitry of claim 3 wherein:
    said signal on said input is a differential signal;
    a first arm of said differential signal is input to a first group of regenerative latches, said first group of regenerative latches comprising a number of latches equal to said second number of clock signals; and
    a second arm of said differential signal is input to a second group of regenerative latches, said second group of regenerative latches comprising a number of latches equal to said second number of clock signals.

5. The circuitry of claim 4 wherein said common mode signal is used as said reference input in each of said first and second groups of regenerative latches.

6. The circuitry of claim 4 wherein:
    said common mode signal is a differential signal;
    a first arm of said differential common mode signal is used as said reference input in said first group of regenerative latches; and
    a second arm of said differential common mode signal is used as said reference input in said second group of regenerative latches.

7. The circuitry of claim 1 further comprising filter circuitry for analyzing outputs of said sampling circuits to determine presence of a signal.

8. A programmable device comprising:
    a quadrature clock source providing four clock phase signals offset from one another by 90° of phase; and
    at least one serial interface,
    each serial interface of said at least one serial interface having:
    an input for receiving a signal, said signal having a data rate with a unit interval, and
    four sampling circuits receiving said signal from said input, each of said four sampling circuits being clocked by a respective one of said clock phase signals from said quadrature clock source; and
    said signal on said input is sampled four times per unit interval.

9. The programmable device of claim 8 wherein each of said sampling circuits comprises a detector including at least one regenerative latch.

10. The programmable device of claim 9 wherein:
    each of said at least one regenerative latch comprises a reference input; and
    a common mode signal is derived from said signal on said input and used as said reference input.

11. The programmable device of claim 10 wherein:
    said signal on said input is a differential signal;
    a first arm of said differential signal is input to a first group of four regenerative latches clocked by said four clock phase signals; and
    a second arm of said differential signal is input to a second group of four regenerative latches clocked by said four clock phase signals.

12. The programmable device of claim 11 wherein said common mode signal is used as said reference input in each of said first and second groups of regenerative latches.

13. The programmable device of claim 11 wherein:
    said common mode signal is a differential signal;
    a first arm of said differential common mode signal is used as said reference input in said first group of regenerative latches; and
    a second arm of said differential common mode signal is used as said reference input in said second group of regenerative latches.

14. The programmable device of claim 8 wherein each serial interface of said at least one serial interface further comprises filter circuitry for analyzing outputs of said sampling circuits to determine presence of a signal.

15. The programmable device of claim 8 wherein said programmable device is a programmable logic device.

16. A signal detection method for use in a serial interface whose input receives a signal having a data rate and a corresponding unit interval, said method comprising:
    sampling said signal on said input a plurality of times during each of said unit intervals to provide a plurality of samples; and
    filtering said plurality of samples to determine presence of a signal on said input.

17. The signal detection method of claim 16 wherein said sampling comprises sampling said signal on said input with a plurality of clock signals having said data rate and being offset in phase from one another.

18. The signal detection method of claim 17 wherein said plurality of clock signals comprises four clock signals offset from one another by 90° of phase.

19. The signal detection method of claim 16 wherein:
said signal is a differential input signal; and
said sampling comprises sampling one arm of said differential input signal.

20. The signal detection method of claim 16 further comprising:
deriving a common mode signal from said differential signal; wherein:
said sampling comprises comparing said one arm of said differential input signal to said common mode signal.

21. The signal detection method of claim 16 wherein:
said signal is a differential input signal; and
said sampling comprises sampling both arms of said differential input signal.

22. The signal detection method of claim 21 further comprising:
deriving a single-ended common mode signal from said differential input signal; wherein:
said sampling comprises comparing said both arms of said differential input signal to said single-ended common mode signal.

23. The signal detection method of claim 21 further comprising:
deriving a differential common mode signal from said differential input signal; wherein:
said sampling comprises comparing said each arm of said differential input signal to a respective arm of said differential common mode signal.

* * * * *